United States Patent [19]
Blümcke et al.

[11] Patent Number: 6,121,605
[45] Date of Patent: Sep. 19, 2000

[54] METHOD FOR THE OPERATION OF AN OPTOELECTRONIC SENSOR

[75] Inventors: Thomas Blümcke, Gutach; Daniel Kietz, Riegel; Kai Waslowski, Emmendingen, all of Germany

[73] Assignee: Sick AG, Waldkirch/Breisgau, Germany

[21] Appl. No.: 09/111,176

[22] Filed: Jul. 8, 1998

[30] Foreign Application Priority Data

Jul. 10, 1997 [DE] Germany ................ 197 29 638

[51] Int. Cl.$^7$ ................................................ G06M 7/00
[52] U.S. Cl. ................. 250/221; 250/223 B; 356/239.4
[58] Field of Search ................ 250/221, 223 B; 356/394, 239.4

[56] References Cited

U.S. PATENT DOCUMENTS

| | | | |
|---|---|---|---|
| 4,428,674 | 1/1984 | Giebel et al. | 356/240 |
| 4,672,837 | 6/1987 | Cottrell. | |
| 5,496,996 | 3/1996 | Barnes et al. | 250/223 B |

FOREIGN PATENT DOCUMENTS

| | | |
|---|---|---|
| 0485857A2 | 5/1992 | European Pat. Off. . |
| 0531646A1 | 3/1993 | European Pat. Off. . |
| 3722600C2 | 7/1990 | Germany . |
| 9010998 U | 12/1990 | Germany . |
| 3934933A1 | 4/1991 | Germany . |
| 4228112C1 | 7/1993 | Germany . |
| 4207772A1 | 9/1993 | Germany . |
| 19525057C1 | 2/1997 | Germany . |
| 19530601A1 | 2/1997 | Germany . |

*Primary Examiner*—Que T. Le
*Assistant Examiner*—Thanh X. Luu
*Attorney, Agent, or Firm*—Townsend and Townsend and Crew LLP

[57] ABSTRACT

The invention relates to a method of operating an optoelectronic sensor, in particular a light barrier, in which a light signal is sent by means of a light transmitter into a monitored region, and a light receiver designed to receive transmitted and reflected light signals delivers a reception signal, the amplitude of which is investigated for the presence of an object in the monitored region, with an article detection signal being transmitted if a recognition threshold is exceeded or fallen short of, characterized in that a plurality of switching threshold values are preset, with a switching signal being triggered when the received signal exceeds or falls short of these switching threshold values, in that the number of the switching signals which arise with respect to each switching threshold is found; and in that the recognition threshold value and the switching threshold values are set or adjusted in dependence on the numbers found.

22 Claims, 2 Drawing Sheets

METHOD FOR THE OPERATION OF AN OPTOELECTRONIC SENSOR

BACKGROUND OF THE INVENTION

The invention relates to a method of operating an optoelectronic sensor, in particular a light barrier, in which a light signal is sent by means of a light transmitter into a monitored region and a light receiver designed to receive transmitted and reflected light signals delivers a reception signal, the amplitude of which is investigated for the presence of an object in the monitored region, with an article detection signal being transmitted if a recognition threshold is exceeded or fallen short of.

It is important for the satisfactory functioning of such methods that the named recognition threshold is correctly set, since with an inadequate setting of the recognition threshold it cannot be precluded that an optical recognition signal is transmitted although no object is present in the monitored region, or that no object recognition signal is transmitted although an object is present in the monitored region.

It is known, for the setting of the recognition threshold value, to allow the latter to be adjusted by the user to a suitable value, for example by means of a potentiometer. However, a manual method of this kind is naturally subject to inaccuracies.

Furthermore it is known, at least in accordance with internal prior art of the applicants, to use teach-in methods in which an object is introduced into the monitored region of the optoelectronic sensor which rates the thereby received signal amplitude with a factor and stores it and uses this stored value as a future recognition threshold value.

The last named method has the disadvantage that the effort of introducing the object into the monitored region must be made and that, as a result of different characteristics of the introduced objects, in particular as a result of different reflectivities, different spacings to the sensor, and also different geometrical shapes of the objects, it cannot be ensured that one always finds the decisive case in the context of the teach-in method for the setting of the recognition threshold value.

Furthermore, it is a disadvantage that a recognition threshold value once set remains constant during the operating period of the sensor, and thus light power fluctuations brought about by the operation, which are for example brought about by the contamination or aging of the light transmitter, cannot be taken into account, so that faulty recognition of objects in the monitored region can arise.

BRIEF SUMMARY OF THE INVENTION

An object of the invention is to improve a method of the initially named kind in such a way that the most accurate possible determination of the recognition threshold is possible at the start of operation which takes account of the actually prevailing operating conditions and/or in such a way that fluctuations of the light power, or of the system sensitivity, which occur during the operation of the sensor can be compensated in a suitable manner. In order to satisfy the named objects, it is proposed, in accordance with the invention, that a plurality of switching threshold values are preset, with a switching signal being triggered when the received signal exceeds or falls short of these switching threshold values, that the number of the switching signals which arise with respect to each switching threshold is found, and that the recognition threshold value and the switching threshold values are set or adjusted in dependence on the numbers found.

The invention makes use of the recognition that the amplitude of the received signal always moves within specific ranges, both when objects are present in the monitored region, and also when the monitored region is free of objects. Since the switching threshold values provided in accordance with the invention are placed in these ranges and/or somewhat above or below these ranges, it is possible to check whether the received signal moves within the expected ranges in the respective operating situations. This check takes place in accordance with the invention in that a count is made as to how often the received signal exceeds or falls short of each of the defined switching threshold values. In this way it is, for example, possible to define switching threshold values which, with an orderly operation of the sensor of the invention, are never exceeded or fallen short of. Furthermore, it is possible to define two switching threshold values such that they are basically always only jointly exceeded or fallen short of when the sensor of the invention is functioning correctly. When, for example, during the operation of the sensor of the invention, the first named switching threshold value is exceeded or fallen short of, or only one of the two last named switching threshold values is exceeded or fallen short of, then it can be concluded that the switching threshold values must be readjusted.

It is then also necessary to newly specify the recognition threshold value which is responsible for the transmission of an article detection signal together with the new determination of the switching threshold values, with this determination being made in dependence on the newly set switching threshold values.

For this purpose, the recognition threshold value can, for example, always be defined in such a way that it is always the same as a switching threshold value multiplied by a predetermined factor. In just the same way it is possible to define one of the switching threshold values directly as the recognition threshold value. It is preferred when one switching threshold value corresponds to the amplitude of the received signal when the monitored region is free of objects. If the method of the invention is used with a reflex light barrier, then this switching threshold can have the highest amplitude of all the switching threshold values provided. This switching threshold value can in this arrangement also correspond to a value somewhat above the amplitude of the received signal when the monitored region is object-free.

It is of advantage when all those switching threshold values which do not correspond to the amplitude of the received signal with an object-free monitored region, each correspond to a predetermined percentage of the named switching threshold value. These percentages lie with a reflex light barrier under 100%. Thus, all switching threshold values have a constant relationship to one another, independent of the momentarily correct setting.

It is particularly advantageous when the switching threshold value having an amplitude which corresponds to the received signal with an object-free monitored region is found prior to taking the sensor into operation and in the context of an initialization process with an object-free monitored region, with the other switching threshold values being calculated in dependence on the said switching threshold value, whereby all switching threshold values are matched to the operating conditions present during the initialization process. Since the recognition threshold value—as already explained—is determined in dependence on the switching threshold values, preferably in dependence on the peak switching threshold value, it can be ensured in the named manner that the recognition threshold value directly after the initialization process is ideally matched to the prevailing operating conditions, whereby the risk of faulty recognitions is significantly reduced. Moreover, it is possible, in accordance with the invention, to carry out the initialization process without having to introduce an object into the monitored region.

During the operation of a sensor it is advantageous, in accordance with the invention, when the numbers of the switching signals that are found, which are each related to the switching threshold values, are brought into relationship with one another, or to a predetermined value, and the respectively valid actual relationships are compared with predetermined desired relationships, with a readjustment of the switching threshold values and of the recognition threshold value only taking place when the actual relationships deviate from the desired relationships. In this case, the sensor operated in accordance with the invention automatically adapts during its operation to the changed operating conditions which can, for example, be brought about by temperature or contamination effects.

The switching threshold values are so adjusted in the context of a readjustment procedure that the ratios of the switching threshold values to one another always remain constant. This signifies that, through a readjustment procedure, a new value for the highest switching threshold value is calculated, for example by means of a regulating algorithm, whereupon all other switching threshold values and also the recognition threshold value are set to new values, which respectively correspond to a fixedly predetermined percentage of the said newly adjusted switching threshold value.

The numbers related to the switching threshold values can in each case be found for the duration of a predetermined operating time interval at the end of which a readjustment takes place if necessary. The readjustment can be repeated during the sensor operation in a constant time pattern.

It is preferred when a total of three or four different switching threshold values are preset, with one of these switching thresholds, for example, being defined as the recognition threshold value.

It is advantageous when the light transmitter of a sensor operating in accordance with the invention is operated with pulsed light.

The invention can be used with a reflex light barrier in which the transmitted light signals are reflected with an object-free monitored region from a reflector arranged at the end of the monitored region opposite to the sensor to the light receiver. In the same way, it is also, however, possible to use the invention when operating a one-way light barrier.

The method of the invention is preferably usable for the recognition of clear glass, which will be explained in more detail in the context of the subsequent description of the Figures.

DESCRIPTION OF THE PREFERRED EMBODIMENTS

FIGS. 1–4 show received signal plots of a sensor operated in accordance with the invention which transmits pulsed light in the direction of the reflector, receives the reflected pulsed light with a photodiode and digitizes its amplitude. The time plot of these digitized amplitudes is shown in FIGS. 1–4.

In accordance with FIGS. 1–4, the sensor is used for the recognition of glass bottles which are transported through the monitored region of the sensor. Characteristic for translucent glass bottles, in particular clear glass bottles, is that the fact that the light which passes through the bottle is more strongly attenuated in the region of the edges of the bottle than the light which passes through the region lying between the edges, since the attenuation of the light in the region of the edges of the bottle due to absorption, reflection and/or refraction is greater than in the region lying between the edges of the bottle. Thus, when a glass bottle of this kind is moved past an optical sensor formed as a reflection light barrier, a relatively pronounced attenuation of the light signal transmitted by the sensor is caused by the edge of the bottle which first moves into the monitored region, whereupon a lower attenuation occurs when the region between the edges of the bottle moves into the monitored region. Finally, when the second edge of the bottle lying to the rear in the direction of conveying moves into the monitored region, there is again a pronounced attenuation of the light signal transmitted from the sensor. For each bottle moved through the monitored region, one thus obtains a substantially W-shaped received signal plot such as is, for example, shown in FIG. 1 for three sequential bottles.

Figure 1:
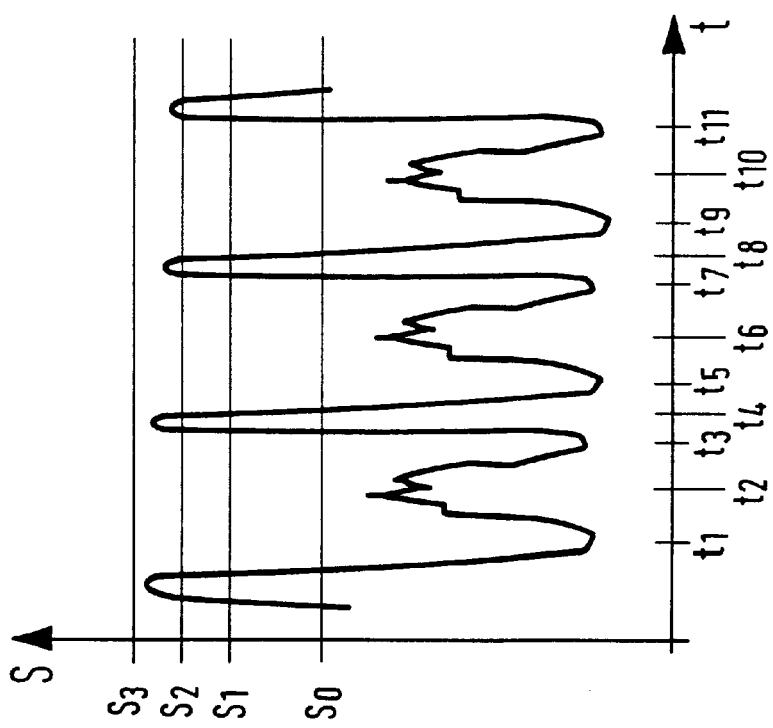
FIG. 1 is a plot of a received signal with correctly adjusted switching threshold values and correctly set recognition threshold value.

The first bottle edge of the first bottle leads at the time $t_1$ to a reduction of the received signal shown in FIG. 1, whereupon the region lying between the edges of the bottle leads to an increase of the received signal at the time $t_2$. The second bottle edge, i.e. the trailing edge in the direction of conveying of the first bottle, then leads again, at the time $t_3$, to a drop in the received signal.

The same applies at the time points $t_5$, $t_6$ and $t_7$ and $t_9$, $t_{10}$ and $t_{11}$ for the second and third bottles which are moved into the monitored region of the sensor after the first bottle.

At the times $t_4$ and $t_8$ there is a pronounced rise in the received signal because the sensor can "look" at these points in time through the space which exists between the first and second bottles and between the second and the third bottles respectively. When these intermediate spaces are located in the monitored region, the light beam transmitted by the sensor can pass directly to the reflector and from the latter back to the sensor without being attenuated by a bottle in the monitored region.

Figure 2:
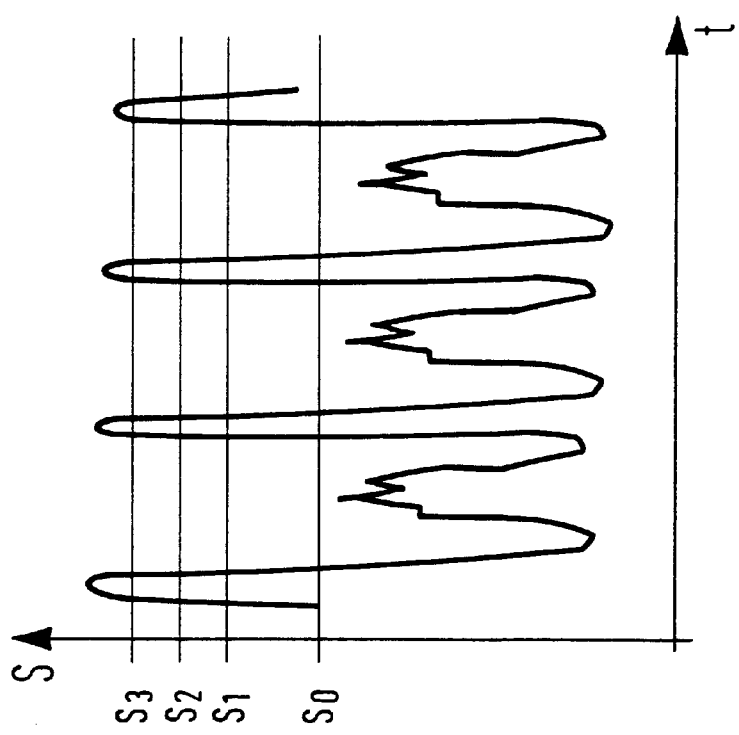
FIG. 2 is a plot of a received signal with the switching threshold values set too low and with the recognition threshold value set too low.
Figure 4:
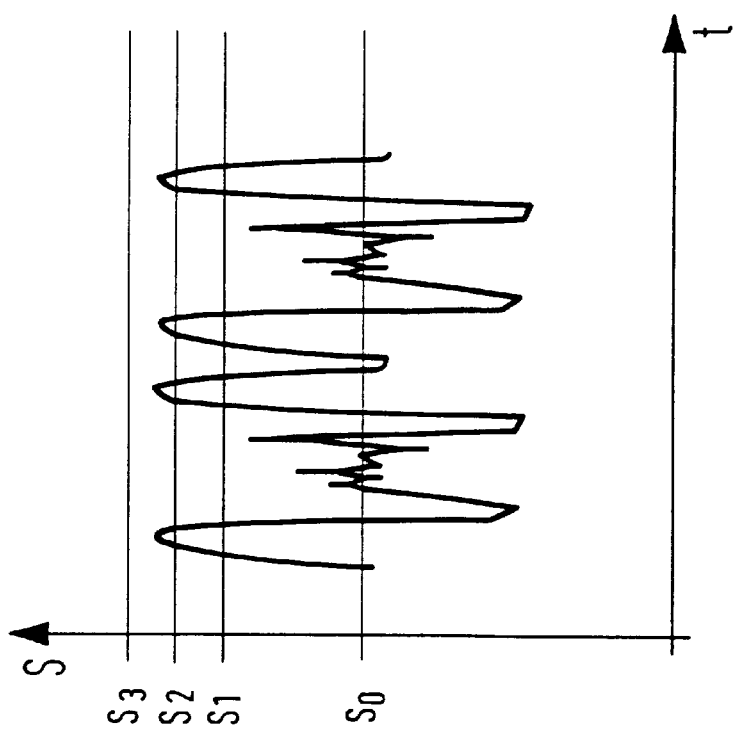
FIG. 4 is a plot of a received signal in an operating case in which an object detection signal cannot be reliably produced.
Figure 3:
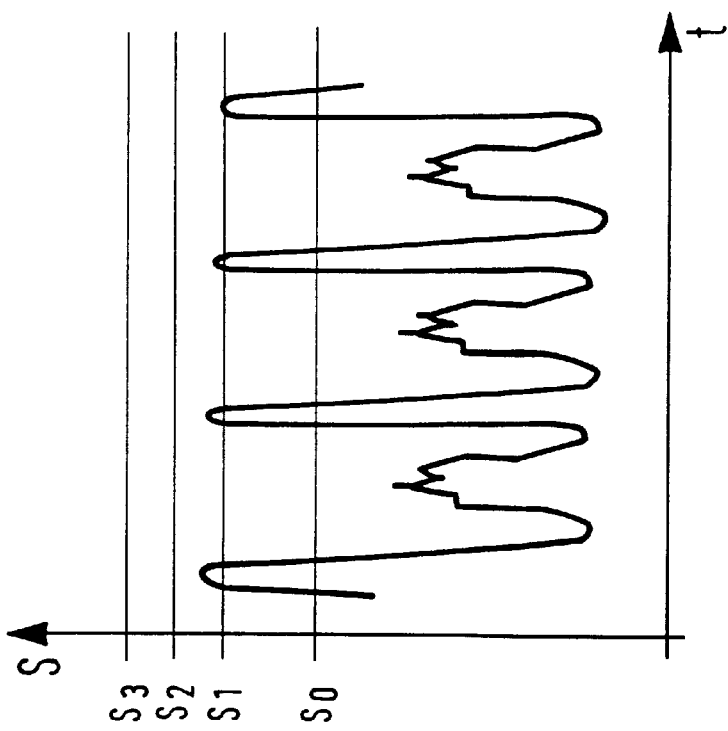
FIG. 3 is a plot of a received signal with the switching threshold values set too high and the recognition threshold value set too high.

In FIG. 1, as in FIGS. 2 to 4, a total of four different switching threshold values $S_0$, $S_1$, $S_2$ and $S_3$ are drawn in. The highest switching threshold value corresponds to an amplitude $S_3$ which is fractionally above the amplitude which the received signal has at the times $t_4$ and $t_8$ when no attenuation of the light takes place in the monitored region. The amplitude of the switching threshold value $S_2$ amounts to 92.5% of the amplitude of the switching threshold value $S_3$. The amplitude of the switching threshold value $S_1$ amounts to 85% of $S_3$ and that of the switching threshold value $S_0$ to 50% of the amplitude of the switching threshold value $S_3$. These percentage relationships apply both before and after a resetting procedure for the switching threshold values in accordance with the invention, so that it is, for example, possible, by means of a regulating algorithm, to calculate only a reset switching threshold value $S_3$ and to calculate the switching threshold values $S_0$, $S_1$ and $S_2$ in accordance with the named percentages.

In a sensor which operates in accordance with the invention there is in each case provided a counter $n_0$, $n_1$, $n_2$ and $n_3$ for each switching threshold value $S_0$, $S_1$, $S_2$ and $S_3$ and this counter is always counted up by 1 when the received signal exceeds the corresponding threshold value.

In the example shown in FIG. 1, the switching threshold values $S_0$, $S_1$ and $S_2$ are in each case exceeded four times, whereas the switching threshold value $S_3$ is never exceeded. After the reception of the signal in accordance with FIG. 1, the following counts would therefore apply:

$$n_0=4, n_1=4; n_2=4, n_3=0.$$

In the illustrated embodiment it can be assumed that the switching threshold values and also the recognition threshold value, which is equal to $S_1$, are correctly set when the following relationships apply:

$$n_3=0 \text{ and } n_1=n_2.$$

The above condition is satisfied in accordance with FIG. 1 when the time interval which elapses between the time points $t_1$ and $t_{11}$ is monitored, so that with a received signal plot in accordance with FIG. 1, no readjustment of the switching threshold values or of the recognition threshold value is necessary. In accordance with FIG. 1 it can therefore be assumed, whenever the recognition threshold value $S_1$ is exceeded by the received signal, that no bottle is present in the monitored region of the sensor, i.e. that the sensor is at such times looking at an intermediate space between two sequential bottles.

The signal plot of FIG. 2 is distinguished from the signal plot of FIG. 1 in that, on recognition of the intermediate spaces, the switching threshold value $S_3$ is also exceeded. The counts for the signal in accordance with FIG. 2 are thus as follows:

$$n_0=4; n_1=4, n_2=4, n_3=4.$$

The desired relationship named in connection with FIG. 1 $n_3=0$ is thus not satisfied in FIG. 2, which signifies that the switching threshold values must be increased. The repetitive error e which is the determining factor for the lifting of the switching threshold values can, for example, be calculated as follows:

$$e=(S_3-S_2)\times n_3/n_2.$$

A new switching threshold of $S_{3 \ (new)}$ can then be calculated in the following manner:

$$S_{3(new)}=S_{3(old)}e \ K,$$ where K is a constant amplification factor.

The other switching threshold values or the recognition threshold value can then be set in accordance with the percentages already named above, with the newly set threshold value $S_{3(new)}$ being used as the reference parameter.

The described lifting of the switching threshold values in an operating situation in accordance with FIG. 2 takes place whenever it is found that a count $n_3>0$ arises in a predetermined operating time interval.

With a signal plot in accordance with FIG. 3, the following counts result:

$$n_0=4; n_1=4, n_2=0; n_3=0.$$

In this case the condition $n_1=n_2$ is no longer satisfied, since $n_2<n_1$. In this case the switching threshold values or the recognition threshold value must be lowered.

The repetitive error e for the lowering can, in this case, be calculated as follows:

$$e=-(S_2-S_1)\times(n_1-n_2)/n_1.$$

The calculation of the new switching threshold value $S_{3(new)}$ and also of the other new switching threshold values and of the recognition threshold value takes place analogously to the operating case of FIG. 2.

The sensitivity of the regulating circuit responsible for the lifting and lowering of the switching threshold values and of the recognition threshold value with respect to disturbances can be reduced if a smaller amplification factor K is set, if the repetitive error e is filtered, or if an interval regulator is used.

The significance of the switching threshold value $S_0$, which is not the determining factor for the raising or lowering of the switching threshold values in accordance with FIGS. 2 and 3, will be described in the following in connection with FIG. 4.

In the embodiment shown in FIG. 4, the switching threshold value $S_0$ amounts to 50% of the switching threshold value $S_3$. The switching threshold value $S_0$ is used for the production of a quality pronouncement with respect to the object detection signals delivered by a sensor operated in accordance with the invention. In the operating case shown in FIG. 4, the following counts are obtained:

$$n_0=12; n_1=4; n_2=4; n_3=0.$$

Whenever, in the predetermined time interval, the count $n_0$ differs from the count $n_1$, which is the case in accordance with FIG. 4, then it can be assumed that the bottles moving past the sensor do not attenuate the transmitted light sufficiently well, so that no reliable object recognition signal can be produced. In the operating case shown in FIG. 4, the region lying between the bottle edges does not adequately attenuate the transmitted light. In this case a warning signal can be transmitted when the condition $n_0=n_1$ is not satisfied.

If, in the operation of the sensor in accordance with the invention, an automatic readjustment cannot take place as a result of particular circumstances, for example in the case of a step reduction in the signal due to contamination, then an initialization process can be manually initiated on the basis of which a further problemfree operation of the sensor can take place.

The method of the invention is not only useful for the recognition of clear glass, but rather can, for example, always be used when objects are to be recognized which only attenuate the transmitted light and do not completely prevent light reception on the part of the sensor. Thus, objects can, for example, also be recognized which only partly obscure the reflector of a reflex light barrier.

What is claimed is:

1. Method of operating an optoelectronic sensor in which a light signal is sent by a light transmitter into a monitored region and in which a light receiver capable of receiving the light signal delivers a reception signal, the amplitude of which is investigated for the presence of an object in the monitored region, an article detection signal being transmitted if a recognition threshold value ($S_1$) is exceeded or fallen short of, wherein a plurality of switching threshold values ($S_0$–$S_3$) are preset, a switching signal is being triggered when the reception signal exceeds or falls short of the switching threshold values ($S_0$–$S_3$), a number ($n_0$–$n_3$) of the switching signals which arise with respect to each switching threshold ($S_0$–$S_3$) is found, and the recognition threshold value ($S_1$) and the switching threshold values ($S_0$–$S_3$) are set or adjusted in dependence on the number ($n_0$–$n_3$) of switching signals found.

2. Method in accordance with claim 1, wherein one switching threshold value ($S_3$) corresponds to the amplitude of the received signals when the monitored region is free of an object.

3. Method in accordance with claim 2, wherein all other switching threshold values ($S_0$–$S_2$) correspond to a preset percentage of said one switching threshold value ($S_3$).

4. Method in accordance with claim 2, wherein prior to taking the sensor into operation in the context of an initialization process when the monitored region is free of an object, the switching threshold value ($S_3$) is found and the other switching threshold values ($S_0$–$S_2$) are calculated in dependence on this switching threshold value ($S_3$), whereby all switching threshold values ($S_0$–$S_3$) are matched to the operating conditions given during the initialization process.

5. Method in accordance with claim 1, wherein the numbers ($n_0$–$n_3$) found which respectively relate to the switching threshold values ($S_0$–$S_3$) are set into relationship to one another and encountered actual relationships are compared with predetermined desired relationships, with a readjustment only taking place when the actual relationships deviate from the desired relationships.

6. Method in accordance with claim 5, wherein the ratios of the switching threshold values ($S_0$–$S_3$) relative to one another are maintained constant and are not changed by the readjustment.

7. Method in accordance with claim 5, wherein the numbers ($n_0$–$n_3$) related to the switching threshold values ($S_0$–$S_3$) are found for the duration of a predetermined operating time interval, at the end of which the readjustment takes place if required.

8. Method in accordance with claim 7, wherein the readjustment is repeated during the sensor operation in a constant time pattern.

9. Method in accordance with claim 1, wherein a total of three or four different switching threshold values ($S_0$–$S_3$) are preset.

10. Method in accordance with claim 9, wherein, with the provision of three switching threshold values ($S_1$–$S_3$), the relationship $S_3 > S_2 > S_1$ applies, with $n_3$, $n_2$ and $n_1$ characterizing the number of switching signals which arise with respect to each switching threshold value ($S_1$–$S_3$) within an operating time interval.

11. Method in accordance with claim 9, wherein predetermined desired relationships are: $n_3 = 0$ and $n_1 = n_2$.

12. Method in accordance with claim 9, wherein the switching threshold values ($S_0$–$S_3$) and the recognition threshold value ($S_1$) are increased when $n_3 > 0$.

13. Method in accordance with claim 9, wherein the switching threshold values ($S_0$–$S_3$) and the recognition threshold value ($S_1$) are lowered when $n_2 > n_1$.

14. Method in accordance with claim 10, wherein a fourth switching threshold value $S_0$ is preset when $S_1 > S_0$.

15. Method in accordance with claim 14, wherein a warning signal is produced when $n_0$ deviates from $n_1$.

16. Method in accordance with claim 1, wherein the switching threshold value ($S_1$) is defined as a recognition threshold value.

17. Method in accordance with claim 1, wherein the light transmitter is operated with pulsed light.

18. Method in accordance with claim 1, wherein in the operation of a reflex light barrier, the transmitted light signals are reflected with an object-free monitored region from a reflector arranged at the end of the monitored region opposite to the sensor to the light receiver.

19. Method in accordance with claim 1 wherein the object comprises clear glass.

20. A method of operating an optoelectronic sensor for determining the presence or absence of an object in a region between a light transmitter and a light receiver comprising the steps of directing a light signal from the transmitter through the region to the light receiver, with the light receiver generating a reception signal responsive to receipt of the light signal from the light transmitter, establishing a plurality of switching threshold values including a recognition threshold value, triggering a switching signal when the reception signal exceeds or falls short of the switching threshold values, sensing the number of switching signals which are generated for each switching threshold, and adjusting the recognition threshold value and the switching threshold values as a function of the number of switching signals that have been sensed.

21. A method according to claim 20 wherein the number of switching threshold values, including the recognition threshold value, is at least three.

22. A method according to claim 21 wherein the number of switching threshold values, including the recognition threshold value, is at least four.

* * * * *